United States Patent [19]

Nakahata et al.

[11] Patent Number: 5,440,189
[45] Date of Patent: Aug. 8, 1995

[54] SURFACE ACOUSTIC WAVE DEVICE

[75] Inventors: Hideaki Nakahata; Naoji Funimori, both of Itami, Japan

[73] Assignee: Sumitomo Electric Industries, Ltd., Osaka, Japan

[21] Appl. No.: 36,259

[22] Filed: Mar. 24, 1993

Related U.S. Application Data

[63] Continuation-in-part of Ser. No. 767,624, Sep. 30, 1991, Pat. No. 5,221,870.

[51] Int. Cl.$^6$ ............................................. H01L 41/08
[52] U.S. Cl. ............................. 310/313 R; 310/313 A
[58] Field of Search ........... 310/313 A, 313 B, 313 R, 310/313 D; 364/819, 821

[56] References Cited

U.S. PATENT DOCUMENTS

| | | | |
|---|---|---|---|
| 4,194,171 | 3/1980 | Jelks | 310/313 R |
| 4,567,392 | 1/1986 | Asai et al. | 310/313 A |
| 4,611,140 | 9/1986 | Whitlock et al. | 310/313 B |
| 4,757,226 | 7/1988 | Mitsutsuka et al. | 310/313 A |
| 4,798,988 | 1/1989 | Mitsutsuka | 310/313 R |
| 4,900,969 | 2/1990 | Mitsutsuka et al. | 310/313 A |
| 4,952,832 | 8/1990 | Imai et al. | 310/313 A |
| 4,967,113 | 10/1990 | Mitsutsuka | 310/313 R |
| 5,043,620 | 8/1991 | Mitsutsuka | 310/313 D |
| 5,061,870 | 10/1991 | Ieki et al. | 310/313 A |
| 5,091,669 | 2/1992 | Mitsutsuka | 310/313 A |
| 5,160,869 | 11/1992 | Nakahata et al. | 310/313 A |
| 5,187,681 | 2/1993 | Mitsutsuka | 364/821 |
| 5,221,870 | 6/1993 | Nakahata et al. | 310/313 A |

FOREIGN PATENT DOCUMENTS

| | | | |
|---|---|---|---|
| 0220910 | 1/1990 | Japan . | |
| 2137413 | 5/1990 | Japan . | |
| 2239715 | 9/1990 | Japan . | |
| 2299309 | 12/1990 | Japan | 310/313 R |

*Primary Examiner*—Thomas M. Dougherty
*Attorney, Agent, or Firm*—Cushman, Darby, & Cushman

[57] ABSTRACT

Surface acoustic eave devices making use of the interaction between surface acoustic wave and carriers include at least a semiconductor part, a piezoelectric layer and an intermediate insulating film. The devices of this invention include diamond or diamond-like carbon as the insulating film in contact with the piezoelectric layer. Since diamond or diamond-like carbon has the highest sound velocity, the surface acoustic wave velocity is extremely high in the piezoelectric layer in contact with diamond or diamond-like carbon. The high surface acoustic wave velocity alleviates the need of producing fine interdigital transducers. This invention is applicable to surface acoustic wave phase-shifters, surface acoustic amplifiers and surface acoustic convolvers.

3 Claims, 6 Drawing Sheets

SURFACE ACOUSTIC WAVE DEVICE

This application is a continuation-in-part of application Ser. No. 07/767,624, which was filed Sep. 30, 1991, and is now issued as U.S. Pat. No. 5,221,870.

FIELD OF THE INVENTION

This invention relates to a surface acoustic wave device, e.g. a surface acoustic wave convolver, a surface acoustic wave phase-shifter, a surface acoustic wave amplifier, etc.

BACKGROUND OF THE INVENTION surface acoustic wave devices are the devices utilizing surface acoustic waves, whose elastic energy is transmitted convergently on the surface of a solid. They are applied to intermediate frequency filters of television sets, since compact devices of stable performance are able to be fabricated. In general, a surface acoustic wave device has a piezoelectric plate and interdigital transducers (IDT) formed on the piezoelectric plate. It is excited by applying alternating voltage to the inter digital transducers. The piezoelectric material for the plate is a bulk monocrystal of quartz, $LiNbO_3$ or $LiTaO_3$, or a ZnO film grown on a substrate by a vapor phase method.

In general, the active frequency f of a surface acoustic wave device is determined by $f=v/\lambda$, where $\lambda$ is a wavelength and v is a propagation velocity of surface acoustic wave. The wavelength $\lambda$ is determined by the spacing frequency of inter digital transducers as shown in FIG. 1. The propagation velocity v is 3500 m/sec to 4000 m/sec for a $LiNbO_3$ monocrystalline piezoelectric plate, and 3300 m/sec to 3400 m/sec for a $LiTaO_3$ monocrystalline piezoelectric plate. It is at most 3000 m/sec for a glass substrate coated with a piezoelectric ZnO film.

The active frequency f can be heightened either by raising the propagation velocity v or by decreasing the wavelength $\lambda$. However, the propagation velocity is restricted by the material property of the piezoelectric plate. The wavelength $\lambda$; spacing frequency of interdigital transducers, is also restricted by a lower limit determined by the current fine processing technology. For example, the current optical lithography technology cannot fabricate a line/groove structure with a width less than 0.8 $\mu$m. Electron beam exposure technology can depict submicron patterns. However, the narrower the line width becomes, the lower the yield. By these reasons, the maximum frequency of current surface acoustic wave devices in practical use is 900 MHz. Recently, satellite communication and mobile radio communication are likely to use higher frequencies for carrier waves of communication. Therefore, new surface acoustic wave devices which work at a frequency in the GHz band have been required. No surface acoustic wave devices operable in the GHz band have been produced to date.

In the case of surface acoustic wave devices utilizing a piezoelectric film grown on a substrate, plural surface acoustic waves (called zeroth mode, first mode, second mode..., according to the order of increasing velocity) are excited, if the sound velocity of the substrate is higher than that of the piezoelectric film. The velocities of all modes depend also on the substrate in the case. The higher the sound velocity of the substrate, the higher the velocities of all modes of the surface acoustic wave of the device including a piezoelectric plate and the substrate are. Roughly speaking, the surface acoustic wave velocity increases in proportion to the sound velocity of the substrate. However, the surface acoustic wave velocity is different from the sound wave velocity. These two velocities must rigorously be distinguished.

In order to heighten the surface acoustic wave velocity, an improved device with a ZnO piezoelectric film grown on a sapphire substrate was proposed by Japanese Patent Laying Open No. 50-154088. Sapphire was chosen as a material for the substrate, because sapphire is favored with high sound velocities; 6000 m/sec for traverse waves and 12000 m/sec for longitudinal waves. It was reported that the surface acoustic wave velocity was 5500 m/sec for the improved device (ZnO/sapphire).

Besides glass and sapphire, diamond is another promising material for a substrate of the surface acoustic wave devices, because of high rigidity. Diamond has the highest sound velocities of all materials. The sound velocity of traverse waves in diamond is 13000 m/sec. The sound velocity of the longitudinal waves is 16000 m/sec. No other material has such high sound velocities. Diamond-like carbon film have sound velocities as high as diamond, because diamond-like carbon film is endowed with as high a rigidity as diamond. If a diamond or diamond-like carbon film was employed to the material of the substrate, an improved surface acoustic wave device would have the surface acoustic wave more than 10000 m/sec. Japanese Patent Laying Opens No. 1-20714 and No. 1-62911 proposed such surface acoustic wave devices having the strata of a diamond substrate and a piezoelectric film.

Besides the simple surface acoustic wave devices with a piezoelectric plate and electrodes, other devices making use of interaction of piezoelectric material with semiconductor have been proposed, i.e., surface acoustic wave convolvers, surface acoustic wave phase-shifters and surface acoustic wave amplifiers.

(a) Surface Acoustic Wave Phase-Shifter

A surface acoustic wave phase-shifter shown in FIG. 2 has been proposed. The phase-shifter has a silicon (Si) semiconductor substrate (21), a silicon dioxide ($SiO_2$) film (22) deposited on the Si substrate (21), lower electrodes (6) formed on ends of the $SiO_2$ film (22), a zinc oxide (ZnO) piezoelectric film (30) deposited on the $SiO_2$ film (22) and the electrodes (6), interdigital transducers (4) formed on ends of the ZnO film (30), a gate electrode (5) formed in the middle of the ZnO film (30), and an ohmic electrode (7) formed on a bottom of the Si substrate (21).

This is a simple, stable surface acoustic wave phase-shifter of monolithic structure. Attention is paid to the application of the phase-shifter to a voltage-controlled oscillator (VCO).

(b) Surface Acoustic Wave Amplifier

A surface acoustic wave amplifier shown in FIG. 3 has been proposed. The amplifier has a lithium niobate ($LiNbO_3$) piezoelectric monocrystalline substrate (23), a silicon dioxide ($SiO_2$) film (24) deposited on the $LiNbO_3$ substrate (23), an indium antimony (InSb) semiconductor film (25) grown on the $SiO_2$ film (24), and a $SiO_2$ film (26) deposited on the InSb film (25).

(c) Surface Acoustic Wave Convolver

A surface acoustic wave convolver shown in FIG. 4 has been proposed. It has a $LiNbO_3$ piezoelectric monocrystalline substrate (27), a $SiO_2$ insulating film (28)

deposited on the LiNbO$_3$ substrate (27), interdigital transducers (18) formed on ends of the LiNbO$_3$ substrate (27), a Si semiconductor film (29) grown on the SiO$_2$ film (28), an upper electrode (19) deposited on the Si film (29) and a lower electrode (20) deposited on the bottom of the LINbO$_3$ substrate (27).

FIG. 5 shows another surface acoustic wave convolver using a ZnO film as a piezoelectric vibrator. It has a Si semiconductor substrate (31), a SiO$_2$ insulating film (32) deposited on the Si substrate (31), a zinc oxide (ZnO) piezoelectric film (33) grown on the SiO$_2$ film (32), interdigital transducers (34) formed on ends of the ZnO film (33) and an output electrode (35) formed on the ZnO film (33). Another output electrode as a ground (36) is formed on the bottom of the Si substrate (31). It has been explained so far that surface acoustic wave phase-shifters, surface acoustic wave amplifier and surface acoustic wave convolvers were proposed as surface acoustic wave devices.

The surface acoustic wave devices works at the frequency (v/λ) determined by the surface acoustic wave velocity (v) and the spacing frequency (λ) of inter digital transducers. In order to raise the performance of the device, the working frequency must be heightened. Heightening the working frequency requires either smaller electrode-distance and electrode-width, or larger surface acoustic wave velocity. But it is difficult to fabricate microscopic interdigital transducers with high yield. As mentioned before, the current optical lithography cannot make electrodes of a line width and a spacing narrower than 0.8 μm with sufficiently high yield. Thus, raising surface acoustic wave velocity is essential to obtain surface acoustic wave devices of high quality in high frequency region (more than 1 GHz).

A purpose of this invention is to provide a surface acoustic wave device with higher surface acoustic wave velocity than the prior art. Another purpose of the invention is to provide a surface acoustic wave device with comparatively wide electrodes and wide spacings therebetween, which can alleviate the difficulty of producing interdigital transducers.

SUMMARY OF THE INVENTION

To accomplish the purposes, this invention provides a surface acoustic wave for utilizing interactions between surface acoustic wave and carriers of semiconductor, having a piezoelectric film, a semiconductor film, inter digital transducers deposited on the piezoelectric layer characterized in that, at least one diamond film or diamond-like carbon film are either deposited on the piezoelectric film or kept between the semiconductor film and the electrodes.

These structures including diamond films can solve the difficulties by increasing the surface acoustic wave velocity.

For the diamond film and the piezoelectric film, both a monocrystalline film and a polycrystalline film are suitable. However, a monocrystalline film is more favorable, because acoustic scattering is smaller in monocrystal than in polycrystal.

Suitable diamond films depend on the structure of the devices; they are divided into two categories (a) and (b).

Case (a): synthesized monocrystalline diamond, natural monocrystalline diamond and a diamond film or a diamond-like carbon film synthesized by CVD methods are equivalently favorable.

Case (b): only a diamond film or a diamond-like carbon film synthesized by CVD methods is exclusively suitable.

In any cases, a diamond film or a diamond-like carbon film can be synthesized by the following vapor phase deposition methods;

(1) Method of activating the material gas by heating a thermal electron emitting material. For example, this method excites the material gas consisting of methane (CH$_4$) and hydrogen (H$_2$) by heating a thermal electron emitting filament.

(2) Method of exciting a material gas by plasma. For example, this method excites the material gas of methane and hydrogen by microwave plasma or radiowave plasma.

(3) Method of exciting a material gas by light, e.g. laser light.

(4) Method of growing diamond by ion bombardment.

(5) Method of burning a material gas, e.g. methane gas (CH$_4$) or ethylene gas (C$_2$H$_2$).

The surface acoustic wave devices of this invention comprise a piezoelectric film, a semiconductor film and a diamond or diamond-like carbon film. According to the kinds of the devices, two different improvements are proposed in this invention regarding the diamond or diamond-like carbon film.

Case (I): such a layer for which an insulator, e.g. silicon dioxide (SiO$_2$) has been conventionally used will be replaced by diamond or diamond-like carbon films.

Case (II): a diamond or diamond-like carbon film will be added to one side or both sides of a piezoelectric film or a semiconductor film.

In the case (I), if the device has more than one insulating layer all of them must not be replaced by diamond or diamond-like carbon films. At least one insulating layer must be replaced, but the others may be still insulators, e.g. SiO$_2$ film. In the case (I), if the insulating layer acts as an intermediate insulator of the MIS structure (metal-insulator-semiconductor), the thickness of the insulating layer is usually less than 1 μm. It is desirable to grow such a thin diamond or diamond-like carbon film by a vapor phase deposition method.

In the case (II), two different structures are possible to make such devices. One is the structure having a diamond monocrystal substrate, a CVD grown diamond or diamond-like carbon film on which a piezoelectric film or a semiconductor film is deposited. The other is the structure having a piezoelectric substrate or a semiconductor substrate on which a diamond or diamond-like carbon film is deposited.

Then the piezoelectric material and the semiconductor material will be now explained.

(1) The piezoelectric material will be: ZnO, AlN, (Zr, Ti) O$_3$, (Pb, La) (Zr, Ti) O$_3$, LiTaO$_3$, LiNbO$_3$, SiO$_2$, Ta$_2$O$_5$, Nb$_2$O$_5$, BeO, Li$_2$B$_4$O$_7$, KNbO$_3$, ZnS, ZnSe or CdS. Especially, a zinc oxide ZnO is the most preferable in the case of a piezoelectric film, because ZnO has a big electromechanical coupling factor and an epitaxial film or a c-axis aligned film of ZnO can easily be grown.

(2) The semiconductor material will be: Si, GaAs, Ge, Se, CdS, CdSe, ZnSe, PbSe, CdTe, ZnTe, PbTe, ZnSb, AlAs, InAs, GaP, InP, AlSb, GaSb or InSb. Besides these conventional semiconductors, diamond semiconductor is also available.

Especially, in the cases of surface acoustic wave amplifiers and surface acoustic wave convolvers which require high carrier mobilities, Si, Ge, GaAs, or InSb is preferable for the semiconductor material, because of the high carrier mobility.

DETAILED DESCRIPTION OF THE PRESENTLY PREFERRED EXEMPLARY EMBODIMENTS

Figure 6:
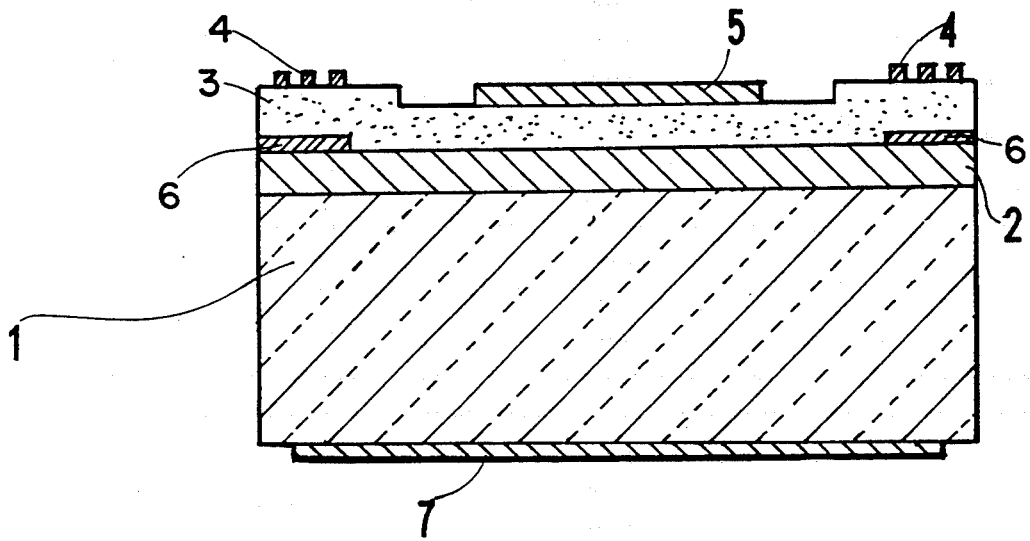
FIG. 6 is a sectional view of a surface acoustic wave phase-shifter as an embodiment of this invention.

Embodiments applied to an elastic surface wave phase-shifter, a surface acoustic wave amplifier and a surface acoustic wave convolver will now be explained.
(a) Surface Acoustic Wave Phase-Shifter (FIG. 6)

This is a surface acoustic wave phase-shifter having a diamond or diamond-like carbon film sandwiched between a piezoelectric layer and a semiconductor.

A diamond or diamond-like carbon film (2) is grown on a semiconductor substrate (1). Counterelectrodes (6) and (6) are formed on sides of the diamond or diamond-like carbon film (2). A piezoelectric layer (3) is deposited on the diamond or diamond-like carbon film and on the counterelectrodes (6). A gate electrode (5) is formed in the middle of the piezoelectric layer (3). Interdigital transducers (4) are formed on both ends of the piezoelectric layer (3). An ohmic electrode (7) is formed on the rear surface of the semiconductor substrate (1).

Figure 1:
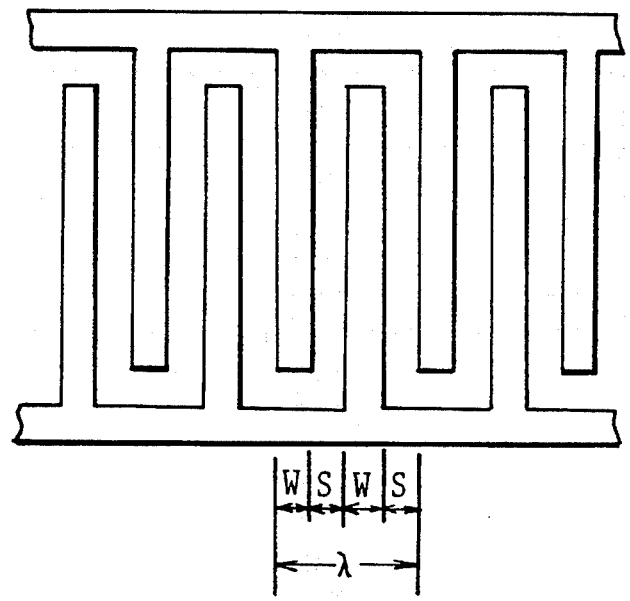
FIG. 1 is a plan view of an inter digital transducer.
Figure 2:
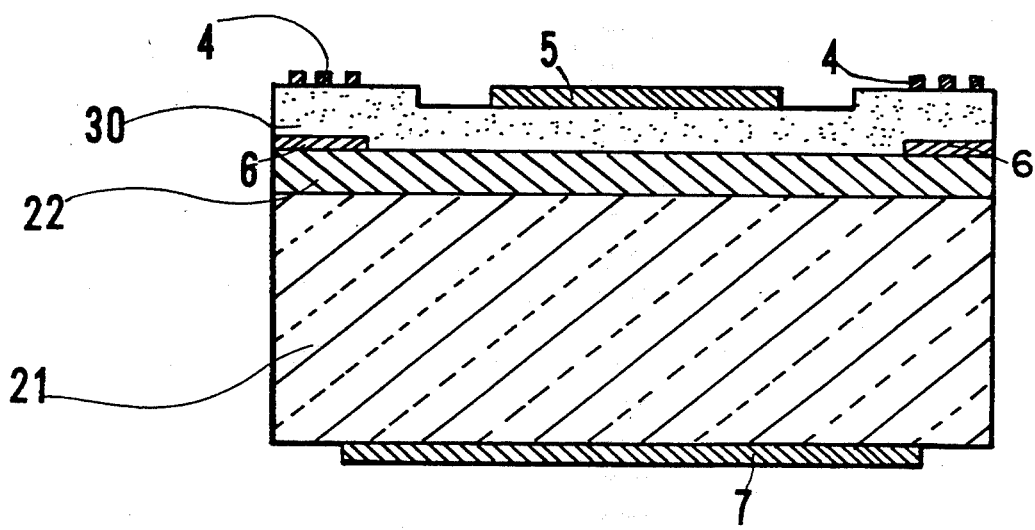
FIG. 2 is a sectional view of a conventional surface acoustic wave phase-shifter.

In comparison with the conventional device shown in FIG. 2, the SiO$_2$ insulating layer (22) has been replaced by a diamond or diamond-like carbon film (2) in the embodiment.

Voltage is applied between the ohmic electrode (7) and the gate electrode (5). An electric field induced in the semiconductor (1) changes the state of carriers. Thus, the capacitance between the gate electrode (5) and the ohmic electrode (7) is varied by the electric field. The change of the capacitance varies the deformation-voltage property of the piezoelectric layer (3).

If the gate electrode (5) is positively biased to the ohmic electrode (7) kept at the ground level, the carriers in the semiconductor increase and the semiconductor loses its resistivity. The insulating diamond or diamond-like carbon film (2) alone contributes to the capacitance between the electrodes (5) and (7). Since the effective thickness of the dielectric material decreases, the capacitance increases.

On the contrary, if the gate electrode (5) is negatively biased to the ohmic electrode (7) kept at the ground level, the carriers decrease in the semiconductor. The depletion layer becomes thicker. The capacitance decreases.

The phase velocity of the surface acoustic wave propagating in the piezoelectric layer changes according to the change of capacitance. Namely, the phase velocity of the surface acoustic wave can be controlled by the voltage applied to the gate electrode (5).

Of course, this function of the surface acoustic wave phase-shifter is well known. Since this invention employs a diamond film or a diamond-like carbon film as an insulator in contact with the piezoelectric layer, the phase velocity of the surface acoustic wave is far higher than that in the prior art using a SiO$_2$ film as an insulator. As mentioned before, the velocity of the surface acoustic wave in the device comprising a substrate and a piezoelectric layer deposited on the substrate depends on the material of the substrate. Owing to the high surface acoustic wave velocity, the device of this invention will favorably be applied to the high frequency region from hundreds of MHz to a few GHz.

Besides the structure shown by FIG. 6, another surface acoustic wave phase-shifter having a piezoelectric layer sandwiched by diamond films can be produced by growing another diamond film on the piezoelectric layer (3) in FIG. 6 and forming the gate electrode (5) on the second diamond film. In the version, the phase velocity of the surface acoustic wave is higher than that in the device with single diamond lining shown in FIG. 6, because the piezoelectric layer is doubly lined with diamond films.

Although the piezoelectric layer (3) should be sandwiched by the interdigital transducers (4) and the counterelectrodes (6), it is not necessary that the interdigital transducers (4) are deposited on an upper surface and the counterelectrodes (6) are deposited on a lower surface. The replacement of the interdigital transducers (4) and the counterelectrodes (6) is permitted. Such a version will have the interdigital transducers (4) between the piezoelectric layer (3) and the diamond film (2) and the counterelectrodes (6) on the piezoelectric layer (3).

Furthermore, the semiconductor substrate (1) can be replaced by a semiconductor film deposited on an insulating substrate. In this case, the ohmic electrode (7) will be sandwiched between the semiconductor film and the insulating substrate. It will be preferable to employ such an insulating substrate coated with a diamond film or a diamond-like carbon film.

Figure 10:
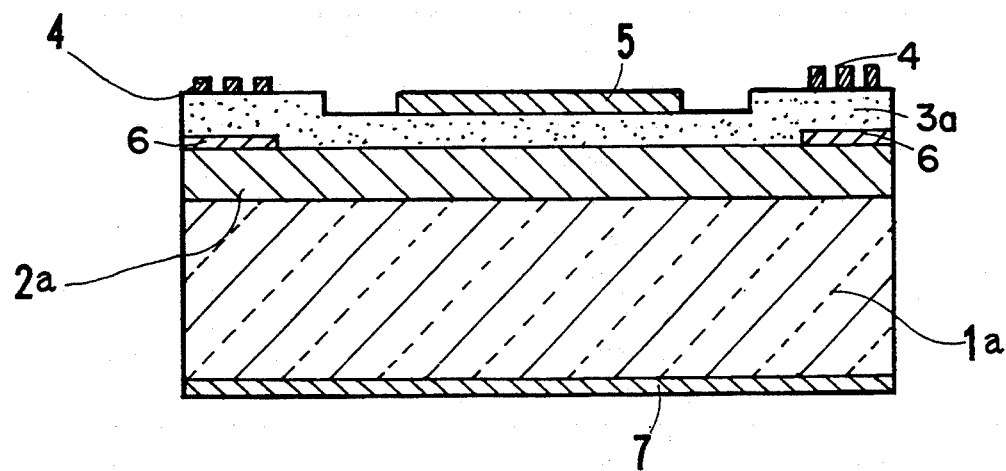
FIG. 10 is a sectional view of a surface acoustic wave phase-shifter as another embodiment of this invention.

Along with the teaching of this invention, a surface acoustic wave phase-shifter shown in FIG. 10 was fabricated. An n-type silicon was used as a substrate. A diamond-like carbon film (2a) was deposited up to a thickness of 500 nm on the n-type silicon substrate by the plasma CVD method using parallel flat electrodes with the material gas of methane (CH$_4$). Counterelectrodes (6) were deposited on an end sides of the diamond-like carbon film (2a). A c-axis aligned ZnO film (3a) was deposited up to 1 $\mu$m on the diamond-like carbon film (2a) and the counterelectrodes (6) by the magnetron sputtering method. A gate electrode (5) and two interdigital transducers (4) with 40 pairs of electrode stripes whose spacing (S) was 2 $\mu$m were formed on the ZnO film (3a). An ohmic electrode (7) was deposited on the n-type Si substrate (1a).

Propagating properties of the surface acoustic wave device fabricated were measured. The central frequency of the propagation spectrum was 1.20 GHz, which was sufficiently high, because there had been no device which had worked at a frequency more than 1 GHz till then. The insertion loss of the device was 28 dB at the central frequency (1.20 GHz).

Furthermore, the phase-shift at the central frequency 1.2 GHz as a function of the applied voltage was also measured. The applied voltage of 0 V to −20 V induced a phase-shift of 0 degrees to 60 degrees of the propagating surface acoustic wave. These results proved excellent performance of the phase-shifter fabricated along with the teaching of the invention.

Figure 7:
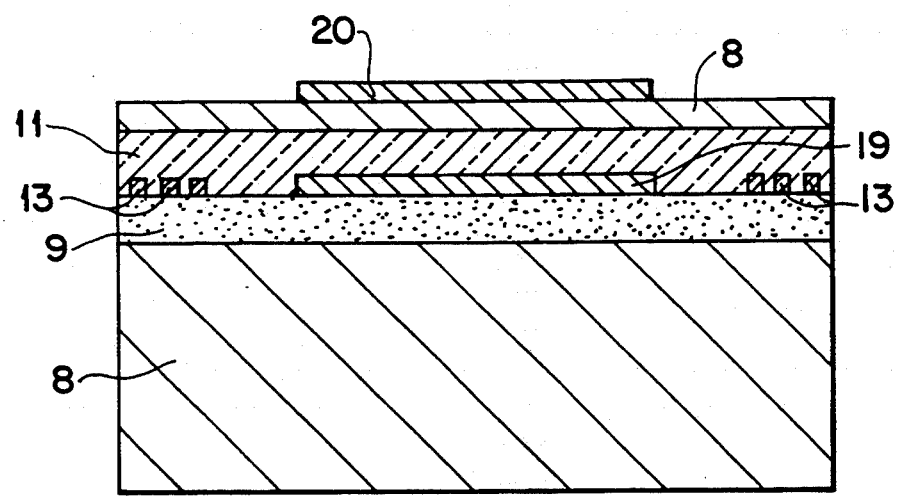
FIG. 7 is a sectional view of a surface acoustic wave amplifier as an embodiment of this invention.

(b) Surface Acoustic Wave Amplifier (FIG. 7)

In FIG. 7, the substrate (8) is a diamond substrate or a diamond-like carbon substrate. A piezoelectric layer (9) is deposited on the diamond or diamond-like carbon substrate (8). Interdigital transducers (13) and (13) are formed on opposite sides of an upper surface of the piezoelectric layer (9). A first electrode (19) is formed on the middle of the same surface of the piezoelectric layer (9) as the interdigital transducers (13) are formed. A semiconductor film (11) is grown on the piezoelectric layer (9) so as to cover the interdigital transducers (13) and the first electrode (19). A diamond or diamond-like carbon film (8') is deposited on the upper surface of the semiconductor film (11). A second electrode is formed on the surface of the diamond or diamond-like carbon film opposite the semiconductor film (11).

Figure 3:
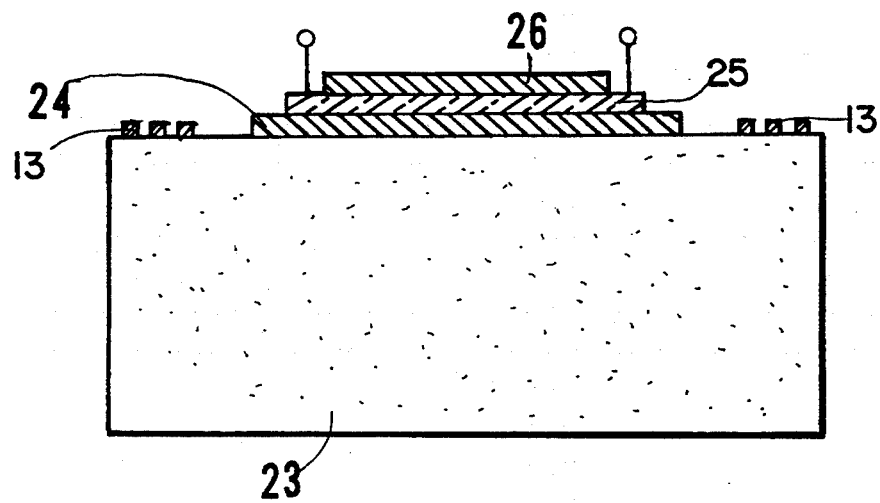
FIG. 3 is a sectional view of a conventional surface acoustic wave amplifier.

In comparison with the prior art shown in FIG. 3, the conventional $SiO_2$ insulating films (24) and (26) have been replaced by diamond or diamond-like carbon films. Furthermore, the $LiNbO_3$ monocrystal has been replaced by a diamond monocrystal substrate or a diamond-like carbon substrate coated with a piezoelectric layer.

Controlling electrodes are formed on both sides of the semiconductor film (11). Voltage for controlling is applied between the controlling electrodes to induce an electric field in the semiconductor film (11). The voltage is applied not in a static manner but in a pulsed manner. The pulsed voltage induces a pulsed electric field in the semiconductor film (11). In the semiconductor film (11), carriers repeatedly run and stop according to the pulsation of the electric field.

On the other hand, AC (alternating current) voltage is applied to one interdigital transducer (13). The AC voltage generates surface acoustic wave in the piezoelectric layer (9). The frequency of the surface acoustic wave is equal to the frequency of the AC voltage of course. The surface acoustic wave propagates in the piezoelectric layer (9) from one interdigital transducer to the another interdigital transducer. The carriers flow in the semiconductor film (11). The surface acoustic wave propagates in the piezoelectric layer (9). By the piezoelectricity of the layer (9), the surface acoustic wave is followed by a vibrating electric field. The carriers in the semiconductor film (11) feel the electric field.

If the carrier velocity is higher than the surface acoustic wave velocity (phase velocity), the carriers are pulled backward and decelerated by the electric field induced by the surface acoustic wave. The energy of the surface acoustic wave increases. Namely, the surface acoustic wave is amplified.

On the contrary, if the carrier velocity is lower than the surface acoustic wave velocity, the carriers are pulled forward and accelerated by the electric field induced by the surface acoustic wave. Thus, the energy of the surface acoustic wave is transferred to the carriers. The energy of the surface acoustic wave decreases. Namely, the surface acoustic wave is attenuated.

In this case, the device is used as an amplifier. The carrier velocity is always higher than the surface acoustic wave velocity. The rate of amplification is controlled by the carrier velocity; namely, by the applied pulsed voltage.

Surface acoustic wave propagates not only in the piezoelectric layer but in the neighboring insulating layers. In this embodiment, the neighboring insulating layers are made from diamond or diamond-like carbon having the highest sound velocity. The diamond or diamond-like carbon films heighten the surface acoustic wave velocity (phase velocity). Therefore, the embodiment can be used in high frequency region more than 1 GHz.

The embodiment shown in FIG. 7 has a diamond or diamond-like carbon substrate. The substrate is able to be replaced by a silicon substrate on which a diamond or diamond-like carbon film is grown. Such a version will be cheaper than the embodiment of FIG. 7.

Figure 8:
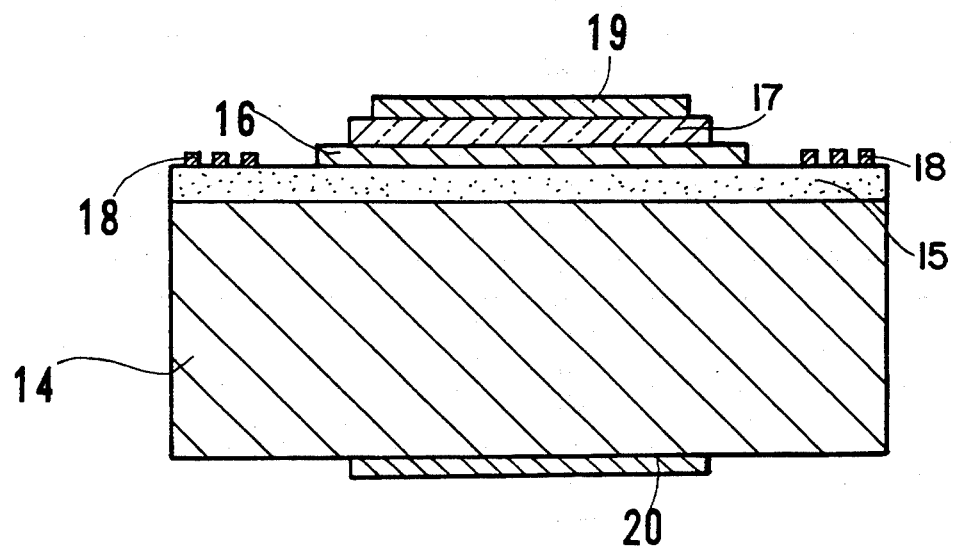
FIG. 8 is a sectional view of a surface acoustic wave convolver as an embodiment of this invention.

(c) Surface Acoustic Wave Convolver (FIG. 8)

In FIG. 8, the substrate (14) is a diamond or diamond-like carbon substrate. A piezoelectric layer (15) is deposited on the substrate (14). Interdigital transducers (18) are formed on both sides of the piezoelectric layer (915). A diamond or diamond-like carbon film (16) is grown on the middle surface of the piezoelectric layer (15). A semiconductor film (17) is deposited on the diamond or diamond-like carbon film (16). An output electrode (19) is formed on the semiconductor film (17). Another output electrode (20) is formed on the bottom of the substrate (14).

Unlike a phase-shifter and an amplifier in which the surface acoustic wave propagates in one direction from one interdigital transducer to the other interdigital transducer, two interdigital transducers (18) and (18) generate two surface acoustic waves. Each surface acoustic wave propagates from the electrode to the central portion of the piezoelectric layer. The two surface acoustic waves collide with each other in the central portion. The collision of the two waves induces the voltage in proportion to the product of the wave functions of the two surface acoustic waves. Since the two surface acoustic waves propagate in reverse directions, the changes of phases of the two wave functions are reversed regarding time. Furthermore, since the two surface acoustic waves are generated at different points, the integral of the product of the two wave functions becomes an integral of the convolution of the two wave functions.

In brief, one wave function $f_1(t,x)$ is written by $$f_1(x,t) = A \sin\{q(x-a) - \omega t\} \quad (1)$$

where A is the amplitude, q is the wave number, $2a$ is the distance between the interdigital transducers (18) and (18), $\omega$ is the angular frequency, x is the coordinate taken along with the piezoelectric layer. By the same notations, the other wave functions $f_2(x,t)$ is written by $$f_2(x,t) = B \sin\{-q(x+a) - \omega t\} \quad (2)$$

where B is the amplitude. The length of the output electrodes (19) and (20) is denoted by $2b$. The output voltage V(t) induced between the electrodes (19) and (20) is given by the integral of the product $f_1(x,t) f_2(x,t)$, $$V(t) = ABk \int_{-b}^{b} \sin\{q(x-a) - \omega t\} \sin\{-q(x+a) - \omega t\} dx \quad (3)$$

where the range of integration is between $-b$ and $+b$, and k is a proportion constant. Replacing $\omega t + q (x+a) = \omega\tau - 2\dot{q}x$, we obtain $$V(t) = (A\ B\ k\omega/q) \int \sin \tau \sin(2\omega t + 2qa - \omega\tau) d\tau$$

This equation means that the output voltage is in proportion to the convolution of the two surface acoustic waves. The frequency of the output wave is the sum of the frequencies of two input waves.

Figure 4:
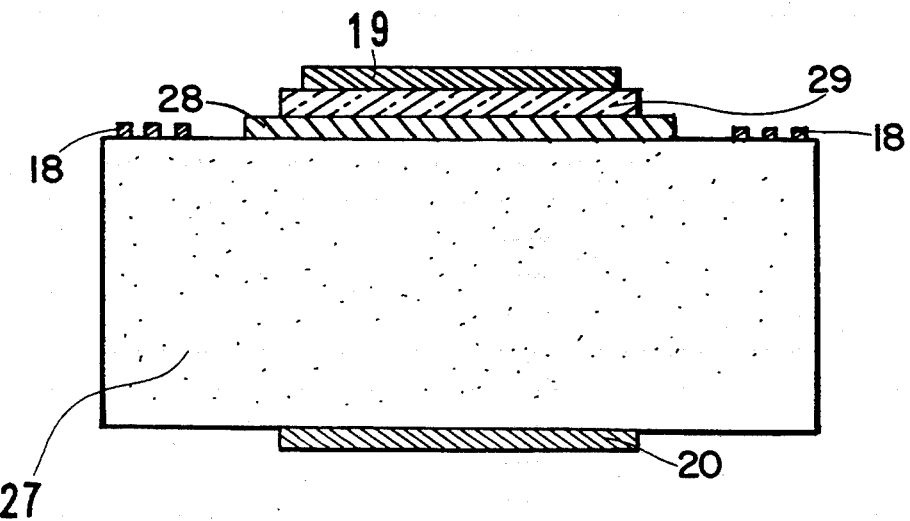
FIG. 4 is a sectional view of a conventional surface acoustic wave convolver.
Figure 5:
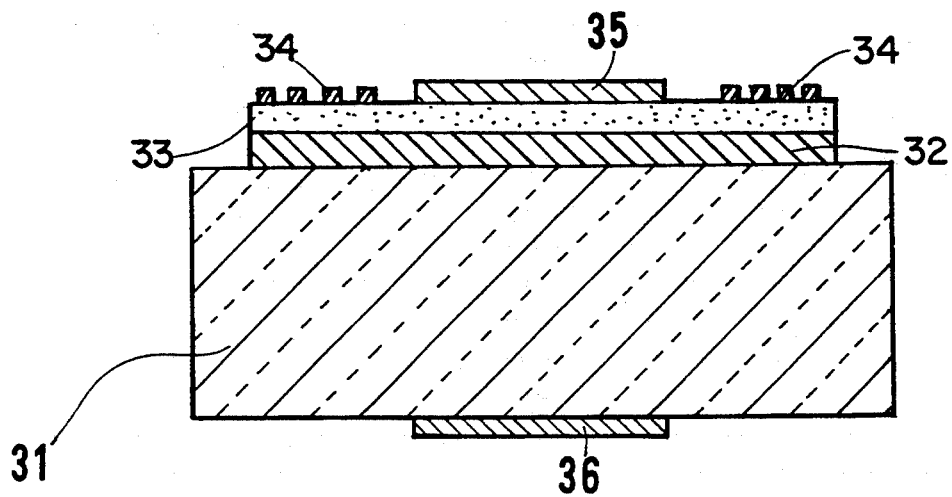
FIG. 5 is a sectional view of another conventional surface wave convolver.

The conventional surface acoustic wave convolver shown in FIG. 4 employed silicon dioxide ($SiO_2$) as insulators. This invention replaces the insulators by diamond or diamond-like carbon. The surface acoustic wave velocity of the convolver of this invention is higher than that of the conventional convolver. Thus, the convolver of this invention works well at high frequencies above 1 GHz.

Figure 9:
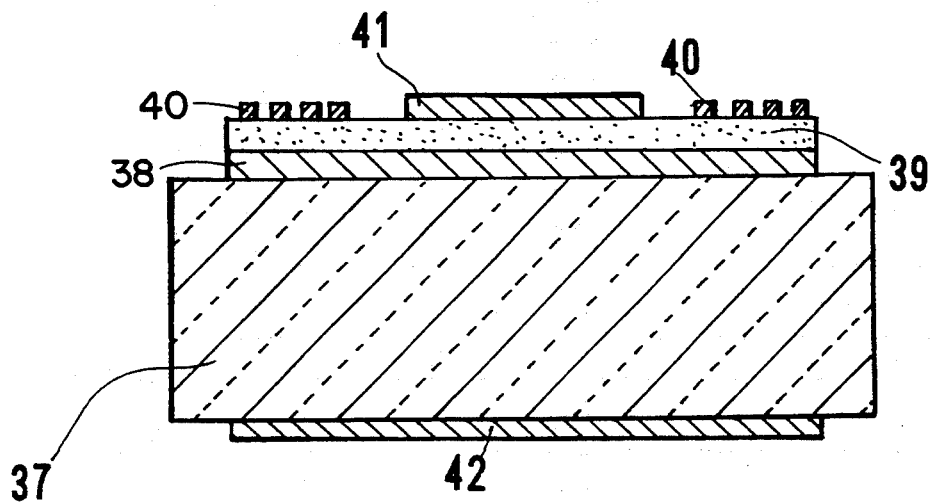
FIG. 9 is a sectional view of a surface acoustic wave convolver as another embodiment of this invention.

FIG. 9 shows another embodiment of a surface acoustic wave convolver. The substrate is a Si semiconductor substrate (37). A diamond film (38) is deposited on the Si substrate (37). A ZnO piezoelectric layer (39) is deposited on the diamond film (38). Interdigital transducers (40) are formed on both sides of the ZnO piezoelectric layer (39). An output electrode (41) is formed in a middle region of the Zn layer (39). Another output electrode (42) is formed on the bottom of the Si substrate (37). In comparison with the former embodiment shown in FIG. 8, the semiconductor film (17) above the piezoelectric layer (15) has been replaced by the Si substrate (37). The diamond or diamond-like carbon substrate (14) has been replaced by the diamond film (38). The diamond film (38) heightens the surface acoustic wave velocity. Through intermediate film, the electric field induced in the ZnO layer (39) interacts with the carriers in the Si substrate (37).

A convolver shown in FIG. 9 was fabricated. A diamond film (38) with a thickness of 0.1 $\mu$m was grown on a Si or GaAs substrate (37) by a chemical vapor deposition method. A ZnO layer (39) with a thickness of 0.5 $\mu$m was deposited on the diamond film (38). Interdigital transducers with a line width of 1 $\mu$m were formed on both sides of the ZnO layer (39). Sine waves with a frequency of 2 GHz were supplied to both interdigital transducers (40) and (40) as input signals. An output sine wave of 4 GHz was generated between the output electrodes (41) and (42). The output electrode (41) is formed on a middle part of the piezoelectric layer on the same side as the interdigital transducers, while output electrode (42) is formed on a middle section of the silicon substrate on a side opposite the diamond film. This results confirmed that the device can surely convolute two input signals supplied to the right and left interdigital transducers. It is a conspicuous feature of the convolver of this invention that such interdigital transducers with a comparatively broad line width of 1 $\mu$m (W=1 $\mu$m, S=1 $\mu$m, $\lambda$=4 $\mu$m) can produce a surface acoustic wave with such a high frequency of 2 GHz. This is owing to the extremely high velocity of surface acoustic wave. Namely, the high velocity of surface acoustic wave alleviates the requirement for producing fine interdigital transducers.

The functions of the invention will now be explained. All devices this invention proposes make use of the interaction between carriers (electrons or holes) and surface acoustic wave. The devices require semiconductor for a supplier of carriers and piezoelectric material for a generator and a transmitting medium for surface acoustic wave. Besides, electrodes, insulators and interdigital transducers are required. The new feature of the invention is to use diamond or diamond-like carbon as insulators instead of conventional insulators, e.g. $SiO_2$.

Diamond is gifted with a traverse sound velocity of 12800 m/sec. This is the highest traverse sound velocity among all materials known at present. Diamond-like carbon has equivalently high traverse sound velocity.

Since the surface acoustic wave propagates in a piezoelectric material, its velocity depends on the sound velocity of the material. The higher the sound velocity, the higher the surface acoustic wave velocity is.

Furthermore, if the piezoelectric material is tightly in contact with a foreign material, the surface acoustic wave velocity depends also on the sound velocity of the foreign material. If the foreign material has high sound velocity, the surface acoustic wave velocity is likely to be pulled up. Namely, the piezoelectric layer deposited on a foreign material with high sound velocity has a higher surface acoustic wave velocity than the same piezoelectric layer deposited on another foreign material with lower sound velocity. A surface acoustic wave propagates on the surface of a piezoelectric layer. Although it resembles traverse sound wave, surface acoustic wave is not traverse sound wave. However, when the piezoelectric layer is in contact with an insulator, the surface acoustic wave velocity is higher, if the insulator has high traverse sound velocity. Of course, the surface acoustic wave velocity depends also on the geometric configuration of the device, e.g. the thickness of the piezoelectric layer or the thickness of the insulating layer. Therefore, the surface acoustic wave velocity cannot uniquely be determined, even if the piezoelectric material and the insulating material are predetermined.

In this invention, since the piezoelectric layer is in contact with diamond or diamond-like carbon, the surface acoustic wave velocity is sufficiently high. As the frequency of the surface acoustic wave is $f = v/\lambda$, the devices of this invention can transmit the wave with higher frequency by the interdigital transducers of the same size. High surface acoustic wave velocity v alleviates the necessity of fine interdigital transducers. In other words, the device of this invention enables wider interdigital transducers to generate waves of the same frequency as in the conventional device.

Fabrication of fine interdigital transducers is so difficult that the yield of devices has been greatly suppressed. This invention succeeds in raising the yield of devices by widening the electrode width and the electrode spacing.

In brief, this invention provides surface acoustic wave devices which work well at frequencies greater than 1 GHz for the first time. If the working frequency is the same, the difficulty for fabricating the interdigital transducers is greatly alleviated.

This invention can be applied to surface acoustic wave phase-shifters, surface acoustic wave amplifiers, surface acoustic wave convolvers and other devices for processing signals, or sensors which make use of the interaction between carriers in semiconductor and surface acoustic wave in piezoelectric material.

What is claimed is:

1. A surface acoustic wave device comprising:
   a diamond or diamond-like carbon substrate,
   a piezoelectric layer deposited on the diamond or diamond-like carbon substrate, interdigital transducers formed on opposite ends of a first surface of said piezoelectric layer, a first electrode formed on a middle part of said first surface, a semiconductor film deposited on said first surface, thereby covering said interdigital transducers and said first electrode, a diamond or diamond-like carbon film deposited on the semiconductor film, on a surface thereof opposite the piezoelectric layer, a second electrode formed on a surface of said diamond or diamond-like carbon film opposite said semiconductor film, wherein one of said interdigital transducers generates a surface acoustic wave, the surface acoustic wave propagates in the piezoelectric layer and the diamond or diamond-like carbon substrate, wherein another of said interdigital transducers converts said surface acoustic wave into electric signals, and wherein AC voltage is applied to the first and second electrodes in order to amplify the surface acoustic wave through the interaction between carriers produced by the AC voltage and the surface acoustic wave.

2. A Surface acoustic wave device as claimed in claim 1, wherein the piezoelectric material is selected from the group consisting of ZnO, AlN, $Pb(Zr,Ti)O_3$, $(Pb,La)(Zr,Ti)O_3$, $LiTaO_3$, $LiNbO_3$, $SiO_2$, $Ta_2O_5$, $Nb_2O_5$, BeO, $Li_2B_4O_7$, $KNbO_3$, ZnS, ZnSe and CdS.

3. A surface acoustic wave device as claimed in claim 1, wherein the semiconductor material is selected from the group consisting of Si, GaAs, Ge, Se, CdS, CdSe, ZnSe, PbSe, CdTe, ZnTe, PbTe, ZnSb, AlAs, InAs, GaP, InP, AlSb, GaSb and InSb.

* * * * *